(12) United States Patent
Park et al.

(10) Patent No.: US 12,290,876 B2
(45) Date of Patent: May 6, 2025

(54) FILM REMOVING METHOD, SUBSTRATE TREATING METHOD, AND SUBSTRATE TREATING APPARATUS

(71) Applicant: SEMES CO., LTD., Cheonan-si (KR)

(72) Inventors: Soo Young Park, Incheon (KR); Ohyeol Kwon, Cheonan-si (KR); Jun Keon Ahn, Sejong-si (KR); Jung Hwan Lee, Pyeongtaek-si (KR); Seong Soo Lee, Suwon-si (KR)

(73) Assignee: Semes Co., Ltd., Cheonan-si (KR)

( * ) Notice: Subject to any disclaimer, the term of this patent is extended or adjusted under 35 U.S.C. 154(b) by 0 days.

(21) Appl. No.: 18/341,838

(22) Filed: Jun. 27, 2023

(65) Prior Publication Data

US 2023/0330768 A1 Oct. 19, 2023

Related U.S. Application Data

(63) Continuation of application No. 16/862,162, filed on Apr. 29, 2020, now abandoned.

(30) Foreign Application Priority Data

Apr. 30, 2019 (KR) .................. 10-2019-0050471

(51) Int. Cl.
*B23K 26/0622* (2014.01)
*B23K 26/08* (2014.01)
(Continued)

(52) U.S. Cl.
CPC ...... *B23K 26/0622* (2015.10); *B23K 26/0823* (2013.01); *B23K 26/40* (2013.01); *B23K 26/103* (2013.01); *B23K 2103/50* (2018.08)

(58) Field of Classification Search
CPC ... A61K 2039/505; A61K 39/00; A61P 31/14; A61P 31/20; B23K 2103/50;
(Continued)

(56) References Cited

U.S. PATENT DOCUMENTS 8,410,394 B2   4/2013  Millman, Jr. et al.
2008/0289651 A1  11/2008  Cheng et al.
(Continued)

FOREIGN PATENT DOCUMENTS

CN   108231658 A   6/2018
CN   108962743 A   12/2018
(Continued)

OTHER PUBLICATIONS

Korean Notice of Allowance dated Jun. 10, 2021 issued in corresponding Korean Appln. No. 10-2019-0050471.
(Continued)

*Primary Examiner* — Brian W Jennison
*Assistant Examiner* — Adam M Eckardt
(74) *Attorney, Agent, or Firm* — Harness, Dickey & Pierce, P.L.C.

(57) ABSTRACT

Disclosed is a method for removing a film from a substrate by irradiating a plurality of unit pulse laser beams to an edge region of the substrate. The method includes a first irradiation operation for irradiating a plurality of unit pulse laser beams onto the substrate while the substrate is rotating, and a second irradiation operation for irradiating a plurality of unit pulse laser beams to regions of the substrate onto which the unit pulse laser beams are not irradiated in the first irradiation operation.

15 Claims, 7 Drawing Sheets

(51) Int. Cl.
  *B23K 26/10* (2006.01)
  *B23K 26/40* (2014.01)
  *B23K 103/00* (2006.01)
(58) Field of Classification Search
  CPC ............ B23K 26/0622; B23K 26/0823; B23K
        26/103; B23K 26/362; B23K 26/40;
        B23K 103/00; B23K 26/08; B23K 26/10;
        C07K 14/005; C07K 14/08; C07K 16/10;
        C07K 16/2827; C07K 16/30; C07K
        16/3023; C07K 16/3038; C07K 16/3061;
        C07K 16/3069; C07K 2317/14; C07K
        2317/565; C07K 2319/00; C12N
        2770/28122; C12N 9/86; C12Q 1/34;
        E05B 15/1607; E05B 17/2003; E05B
        63/06; E05C 9/041; E05C 9/042; E05C
        9/20; G01N 2333/70532; G01N
        2333/70596; G01N 2333/986; G01N
        33/57484; G01N 33/5767; G01N 33/577;
        G01N 33/70; G06F 13/1689; Y10S
        435/81; Y10S 435/975; H01L 21/67051;
        H01L 21/67115
  See application file for complete search history.

(56) References Cited

U.S. PATENT DOCUMENTS

| | | |
|---|---|---|
| 2011/0139759 A1 | 6/2011 | Millman, Jr. et al. |
| 2011/0168672 A1 | 7/2011 | Harte et al. |
| 2012/0234810 A1 | 9/2012 | Kudo et al. |
| 2013/0014905 A1* | 1/2013 | Nakazawa ......... B23K 26/0624 156/753 |
| 2018/0158703 A1* | 6/2018 | Aslanov ............. G02B 19/0009 |
| 2018/0321566 A1 | 11/2018 | Geerlings |
| 2020/0035517 A1* | 1/2020 | Hidaka ................ H01L 21/0206 |
| 2020/0346300 A1* | 11/2020 | Park .................. H01L 21/67051 |

FOREIGN PATENT DOCUMENTS

| | | |
|---|---|---|
| JP | 2003-197570 A | 7/2003 |
| JP | 2004-322106 A | 11/2004 |
| JP | 2005-081420 A | 3/2005 |
| JP | 2005-243747 A | 9/2005 |
| JP | 2008-283054 A | 11/2008 |
| JP | 2010-172959 A | 8/2010 |
| JP | 2018-113378 A | 7/2018 |
| JP | 2019-038295 A | 3/2019 |
| KR | 100432854 B1 | 5/2004 |
| KR | 101037142 B1 | 5/2011 |
| KR | 101557586 B1 | 10/2015 |
| KR | 10-2015-0141140 A | 12/2015 |
| KR | 10-2016-0110780 A | 9/2016 |
| KR | 10-2018-0039199 A | 4/2018 |
| KR | 10-2018-0127150 A | 11/2018 |
| KR | 10-2019-0037479 A | 4/2019 |

OTHER PUBLICATIONS

Japanese Office Action dated Oct. 4, 2022 issued in Japanese Patent Application No. 2020-079347.
Chinese Office Action dated Jan. 15, 2024 issued in Chinese Patent Application No. 202010361352.5.

* cited by examiner

FILM REMOVING METHOD, SUBSTRATE TREATING METHOD, AND SUBSTRATE TREATING APPARATUS

CROSS-REFERENCE TO RELATED APPLICATIONS

This application is a continuation of U.S. application Ser. No. 16/862,162, filed on Apr. 29, 2020, which claims priority under 35 U.S.C. § 119 to Korean Patent Application No. 10-2019-0050471 filed on Apr. 30, 2019 in the Korean Intellectual Property Office, the entire contents of each of which are hereby incorporated by reference.

BACKGROUND

Embodiments of the inventive concept described herein relate to a film removing method, a substrate treating method, and a substrate treating apparatus.

Various processes such as application, photographing, deposition, ashing, etching, and ion implantation are performed during treating of a glass panel such as that used for manufacturing a substrate, for example, a semiconductor wafer or a flat panel display. As the process for treating the substrate is performed, a cured thin-film is coated or deposited on a surface of the substrate. Further, an edge bead removing process is required to increase a production yield at an edge of the substrate. The edge bead removing process removes an unwanted thin-film and an attached byproduct polymer from the edge region of the substrate.

FIG. 1 is a view showing performing an edge bead removing process in a conventional substrate treating apparatus. Referring to FIG. 1, the conventional substrate treating apparatus 1 has a rotary chuck 2 and a nozzle 4. The rotary chuck 2 supports and rotates a substrate W. The nozzle 4 sprays chemical C on an edge region of the substrate W. Each nozzle 4 is disposed above and below the substrate W to spray the chemical C on top and bottom surfaces of the substrate W. The sprayed chemical C removes a thin-film F disposed on the edge region of the substrate W. However, when the edge bead removing process is performed by spraying the chemical C, the removal of the thin-film F in the edge region of the substrate W is not properly performed. For example, as shown in FIG. 2, the thin-film F in the edge region of the substrate W may be removed obliquely downwards outwardly in a radial direction of the substrate W. This is because the liquid chemical C is supplied while the substrate W is rotated. When the removal of the thin-film F in the edge region of the substrate W is not performed properly, a yield of a production process is reduced. Moreover, there is a risk of additional contamination due to formation of a pin mark on a surface of the substrate W after the removal process.

SUMMARY

Embodiments of the inventive concept provide a film removing method, a substrate treating method, and a substrate treating apparatus in which a film is removed from a substrate at high efficiency.

Moreover, embodiments of the inventive concept provide a film removing method, a substrate treating method, and a substrate treating apparatus in which a film removing efficiency increases by irradiating a plurality of unit pulse laser beams onto a film on a substrate.

Moreover, embodiments of the inventive concept provide a film removing method, a substrate treating method, and a substrate treating apparatus in which a film removed region is minimized by irradiating a plurality of unit pulse laser beams onto a film on a substrate.

Moreover, embodiments of the inventive concept provide a film removing method, a substrate treating method, and a substrate treating apparatus in which deformation due to heat accumulation (ablation threshold) is minimized at a substate or a film in a region other than an edge region of the substrate.

The purposes of the inventive concept are not limited thereto. Other purposes as not mentioned will be clearly understood by those skilled in the art from following descriptions.

According to an exemplary embodiment, a method for removing a film from a substrate by irradiating a plurality of unit pulse laser beams to an edge region of the substrate includes a first irradiation operation for irradiating a plurality of unit pulse laser beams on the substrate while the substrate is rotating, and a second irradiation operation for irradiating a plurality of unit pulse laser beams to regions of the substrate onto which the unit pulse laser beams are not irradiated in the first irradiation operation.

The first irradiation operation and the second irradiation operation may be sequentially performed, wherein the second irradiation operation may be performed when a preset time has elapsed after the first irradiation operation is completed.

Each of the unit pulse laser beams may have a wavelength below an ablation threshold at which ablation occurs in the film.

Each of the unit pulse laser beams may have a wavelength of 150 nm to 1200 nm.

Each of the unit pulse laser beams irradiated to the substrate in the first irradiation operation and/or the second irradiation operation may have a cross-sectional circular shape.

Each of the unit pulse laser beams irradiated to the substrate in the first irradiation operation and/or the second irradiation operation may have a cross-sectional quadrangular shape.

The first irradiation operation may include irradiating the unit pulse laser beams while an irradiation position of the unit pulse laser beams is displaced along a circumferential direction of the substrate while the substrate rotates, and irradiating the unit pulse laser beams while an irradiation position of the unit pulse laser beams is displaced along a radial direction of the substrate.

The second irradiation operation may include irradiating the unit pulse laser beams while an irradiation position of the unit pulse laser beams is displaced along a circumferential direction of the substrate while the substrate rotates, and irradiating the unit pulse laser beams while an irradiation position of the unit pulse laser beams is displaced along a radial direction of the substrate.

According to an exemplary embodiment, a method for treating a substrate includes a first irradiation operation for irradiating a plurality of unit pulse laser beams to the substrate while the substrate is rotating, and subsequently, a second irradiation operation for irradiating a plurality of unit pulse laser beams to the substrate while the substrate is rotating, wherein in the first irradiation operation, a pulse width of each of the unit pulse laser beams is set so that regions of the substrate onto which the unit pulse laser beams are irradiated respectively do not overlap each other, wherein in the second irradiation operation, the unit pulse laser beams are respectively irradiated onto regions between adjacent regions among the regions receiving the unit pulse laser beams respectively in the first irradiation operation.

The first irradiation operation may include irradiating the unit pulse laser beams while an irradiation position of the unit pulse laser beams is displaced along a circumferential direction of the substrate while the substrate rotates, and irradiating the unit pulse laser beams while an irradiation position of the unit pulse laser beams is displaced along a radial direction of the substrate.

The second irradiation operation may include irradiating the unit pulse laser beams while an irradiation position of the unit pulse laser beams is displaced along a circumferential direction of the substrate while the substrate rotates, and irradiating the unit pulse laser beams while an irradiation position of the unit pulse laser beams is displaced along a radial direction of the substrate.

Each of the unit pulse laser beams irradiated to the substrate in the first irradiation operation and/or the second irradiation operation may have a cross-sectional circular shape.

Each of the unit pulse laser beams irradiated to the substrate in the first irradiation operation and/or the second irradiation operation may have a cross-sectional quadrangular shape having a round corner.

The treating may include removing the film from the substrate using the laser.

The film to be removed using the laser may be disposed on an edge region of the substrate.

The second irradiation operation may be performed when a preset time has elapsed after the first irradiation operation is completed.

According to an exemplary embodiment, an apparatus for treating a substrate includes a housing having an inner space, a support unit received in the inner space for supporting and rotating the substrate, a laser irradiation unit for irradiating a plurality of unit pulse laser beams onto the substrate supported on the support unit, and a controller to control the support unit and the laser irradiation unit. The controller may control the support unit to rotate the substrate supported on the support unit, control a combination of the support unit and the laser irradiation unit to perform a first irradiation operation for irradiating a plurality of unit pulse laser beams to the substrate while the substrate is rotating, wherein in the first irradiation operation, a pulse width of each of the unit pulse laser beams is set so that regions of the substrate onto which the unit pulse laser beams are irradiated respectively do not overlap each other, and subsequently, control a combination of the support unit and the laser irradiation unit to perform a second irradiation operation for irradiating a plurality of unit pulse laser beams to the substrate while the substrate is rotating, wherein in the second irradiation operation, the unit pulse laser beams are respectively irradiated onto regions between adjacent regions among the regions receiving the unit pulse laser beams respectively in the first irradiation operation.

The controller may control a combination of the support unit and the laser irradiation unit such that the second irradiation operation is performed when a preset time has elapsed after the first irradiation operation is completed.

The controller may control the laser irradiation unit such that each of the unit pulse laser beams has a wavelength below an ablation threshold at which ablation occurs in the film.

The controller may control the laser irradiation unit such that each of the unit pulse laser beams has a wavelength of 150 nm to 1200 nm.

The laser irradiation unit may include a laser light source for generating the unit pulse laser beams, a laser irradiation member for irradiating the unit pulse laser beams received from the laser light source to the substrate supported on the support unit, and a driving member for moving the laser irradiation member so that an irradiation position of the unit pulse laser beams varies along a radial direction of the substrate.

The controller may control the laser irradiation member to irradiate the unit pulse laser beams to an edge region of the substrate supported on the support unit.

The laser irradiation unit further may include a wavelength adjusting member for changing a wavelength of each of the unit pulse laser beams received from the laser light source, and a shape adjusting member for changing a shape of each of the unit pulse laser beams received from the laser light source.

The shape adjusting member may change a shape of each of the unit pulse laser beams to a cross-sectional circular shape.

The shape adjusting member may change a shape of each of the unit pulse laser beams to a cross-sectional quadrangular shape.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
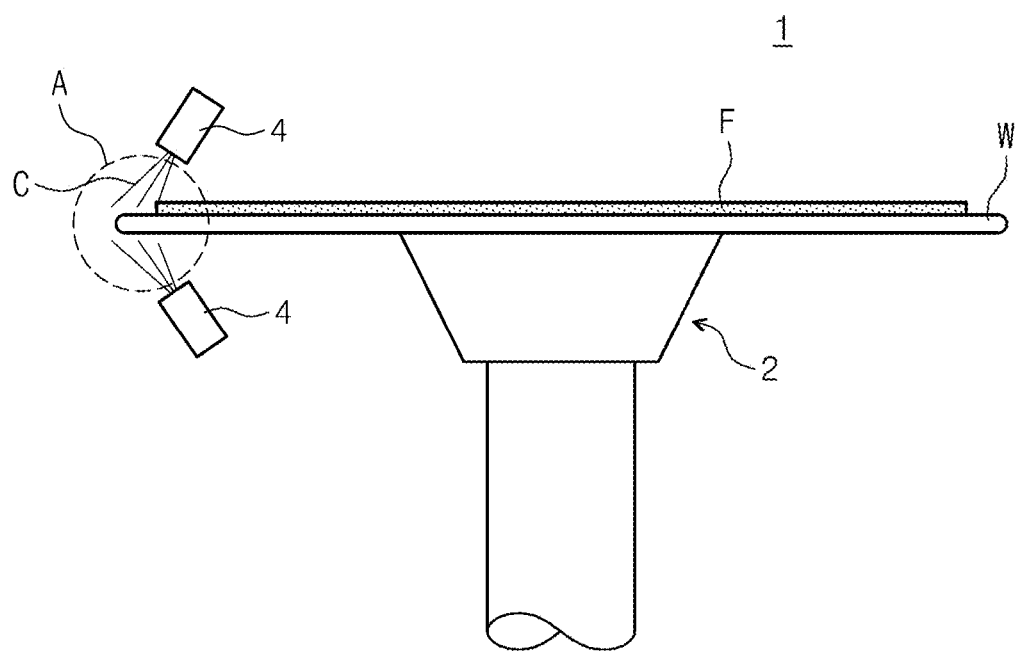
FIG. 1 is a view showing performing an edge bead removing process in a conventional substrate treating apparatus.

Hereinafter, embodiments of the inventive concept will be described in detail with reference to the accompanying drawings such that the embodiment is easily implemented by those of ordinary skill in the art. However, the inventive concept may be implemented in many different forms and is not limited to the embodiments described herein. Moreover, in detailed descriptions of a preferred embodiment of the inventive concept, when it is determined that detailed descriptions of related known functions or components may unnecessarily obscure gist of the inventive concept, the detailed descriptions thereof may be omitted. Moreover, the same reference numerals are used for parts having similar functions throughout the drawings.

The terminology used herein is for the purpose of describing particular embodiments only and is not intended to be limiting of the present disclosure. It will be further understood that the terms "comprises", "comprising", "includes", and "including" when used in this specification, specify the presence of the stated features, integers, operations, devices, and/or components, but do not preclude the presence or addition of one or more other features, integers, operations, devices, components, and/or portions thereof. As used herein, the term "and/or" includes any and all combinations of one or more of the associated listed items.

As used herein, the singular forms "a" and "an" are intended to include the plural forms as well, unless the context clearly indicates otherwise. For simplicity and clarity of illustration, devices in the figures are not necessarily drawn to scale.

Hereinafter, embodiments of the inventive concept will be described in detail with reference to FIG. 3 to FIG. 13.

Figure 3:
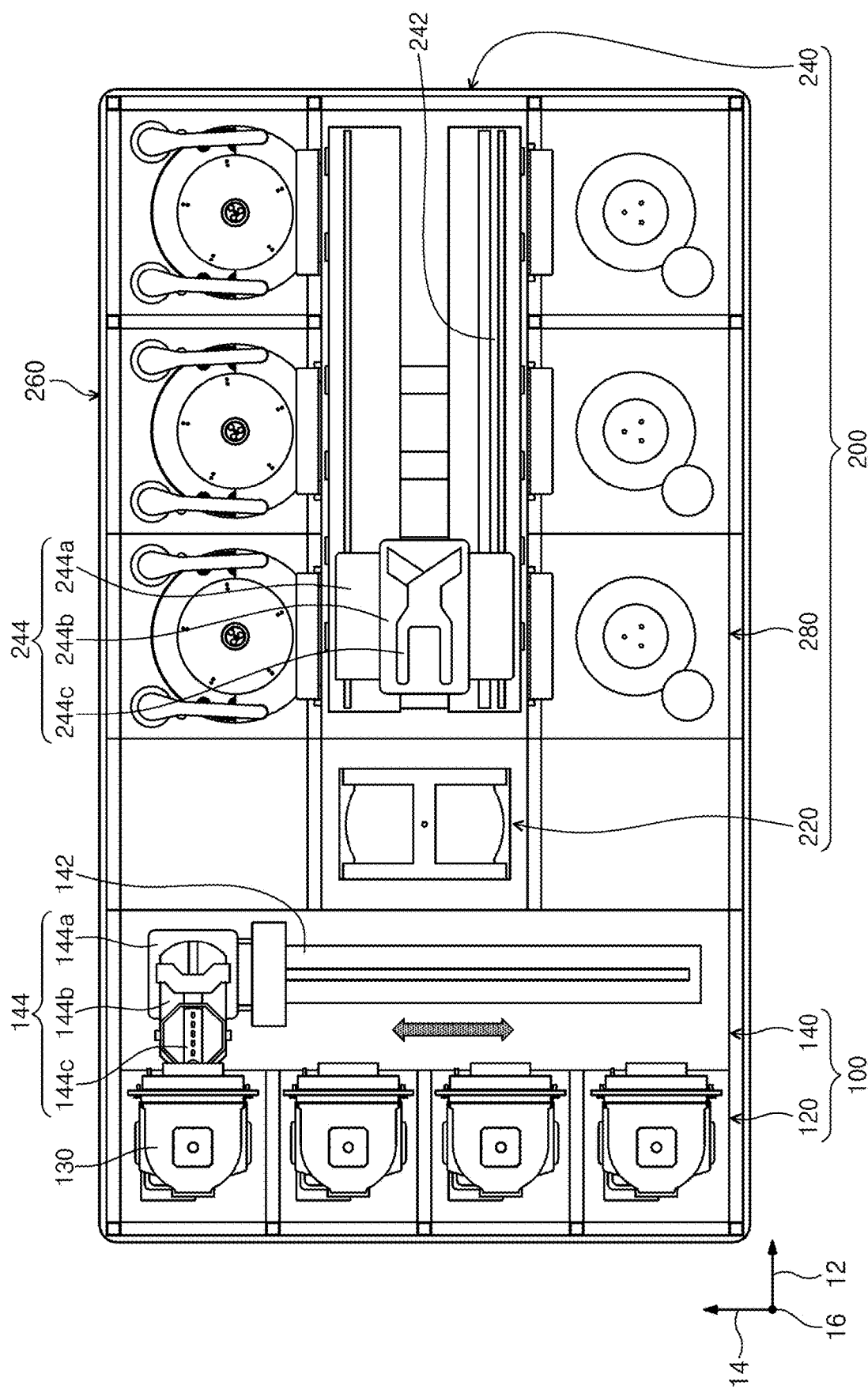
FIG. 3 is a plan view showing a substrate treating system according to an embodiment of the inventive concept.

FIG. 3 is a plan view showing a substrate treating system according to an embodiment of the inventive concept. Referring to FIG. 3, a substrate treating system 10 has an index module 100 and a process treating module 200. The index module 100 has a load port 120 and a transfer frame 140. The load port 120, the transfer frame 140, and the process treating module 200 are sequentially arranged in series. Hereinafter, a direction in which the load port 120, the transfer frame 140, and the process treating module 200 are arranged is referred to as a first direction 12. When viewed from above, a direction perpendicular to the first direction 12 is referred to as a second direction 14, and a direction perpendicular to a plane including the first direction 12 and the second direction 14 is referred to as a third direction 16.

A carrier 130 receiving a substrate W therein is seated on the load port 120. A plurality of load ports 120 are provided, which are arranged in a line along the second direction 14. The number of the load ports 120 may increase or decrease depending on process efficiency and a footprint condition of the process treating module 200. The carrier 130 has a plurality of slots (not shown) for receiving therein the substrates W in a horizontal orientation relative to a ground. The carrier 130 may employ a front opening unified pod (FOUP).

The process treating module 200 includes a buffer unit 220, a transfer chamber 240, a liquid treating chamber 260, and a laser treating chamber 280. The transfer chamber 240 has a length direction parallel to the first direction 12. The liquid treating chambers 260 and the laser treating chambers 280 are disposed on both sides of the transfer chamber 240, respectively. The liquid treating chambers 260 and the laser treating chambers 280 disposed on one side and the other side to the transfer chamber 240 respectively are arranged to be symmetrical with each other around the transfer chamber 240. A plurality of liquid treating chambers 260 are provided on one side to the transfer chamber 240. Some of the liquid treating chambers 260 are arranged along a length direction of the transfer chamber 240. Moreover, some of the liquid treating chambers 260 are stacked on top of each other. That is, on one side to the transfer chamber 240, the liquid treating chambers 260 may be arranged in a matrix of A×B. In this connection, A refers to the number of liquid treating chambers 260 arranged in a line along the first direction 12, while B refers to the number of liquid treating chambers 260 arranged in a line along the third direction 16. When four or six liquid treating chambers 260 are provided on one side to the transfer chamber 240, the liquid treating chambers 260 may be arranged in a matrix of 2×2 or 3×2. The number of liquid treating chambers 260 may be increased or decreased. In addition, the laser treating chambers 280 may be arranged on the other side to the transfer chamber 240 in a similar manner to the arrangement of the liquid treating chambers 260. Unlike the above arrangement, an arrangement of the liquid treating chambers 260 and an arrangement of the laser treating chambers 280 may be modified in various ways. For example, the liquid treating chambers 260 and the laser treating chambers 280 may be disposed on only one side to the transfer chamber 240. Moreover, the liquid treating chambers 260 and the laser treating chambers 280 may constitute respectively a single layer on one side and both sides to the transfer chamber 240.

The buffer unit 220 is disposed between the transfer frame 140 and the transfer chamber 240. The buffer unit 220 provides a space where the substrate W stays before the substrate W is transferred between the transfer chamber 240 and the transfer frame 140. The buffer unit 220 has a slot (not shown) defined therein into which substrate W is placed is disposed. Multiple slots (not shown) may be arranged to be spaced apart from each other along the third direction 16. The buffer unit 220 has an open face facing the transfer frame 140 and an open face facing the transfer chamber 240.

The transfer frame 140 transfers the substrate W between the carrier 130 seated on the load port 120 and the buffer unit 220. The transfer frame 140 has an index rail 142 and an index robot 144. The index rail 142 has a length direction parallel to the second direction 14. The index robot 144 is installed on the index rail 142, and linearly moves in the second direction 14 along the index rail 142. The index robot 144 has a base 144a, a body 144b, and an index arm 144c. The base 144a is configured to be movable along the index rail 142. The body 144b is coupled to the base 144a. The body 144b is configured to be movable along the third direction 16 and on the base 144a. Moreover, the body 144b is configured to be rotatable on the base 144a. The index arm 144c is coupled to the body 144b, and is configured to be movable forward and backward relative to the body 144b. A plurality of index arms 144c are configured to be individually driven. The index arms 144c are arranged to be space apart from each other along the third direction 16 in a stacked manner. Some of the index arms 144c may be used to transfer the substrate W from the process treating module 200 to the carrier 130. The others of the index arms 144c may be used for transferring the substrate W from the carrier 130 to the process treating module 200. This configuration may prevent particles generated from the substrate W before the process treating from being attached to the substrate W during the index robot 144 imports and exports the substrate W.

The transfer chamber 240 transfers the substrate W between the buffer unit 220 and the liquid treating chamber 260, between the buffer unit 220 and the laser treating chamber 280, between the liquid treating chambers 260, between the laser treating chambers 280, and between the liquid treating chamber 260 and the laser treating chamber 280. That is, the transfer chamber 240 acts as a transfer unit for transferring the substrate W. The transfer chamber 240 has a guide rail 242 and a main robot 244. The guide rail 242 has a length direction parallel to the first direction 12. The main robot 244 is installed on the guide rail 242, and linearly moves along the first direction 12 and on the guide rail 242. The main robot 244 has a base 244a, a body 244b, and a main arm 244c. The base 244a is configured to be movable along the guide rail 242. The body 244b is coupled to the base 244a. The body 244b is configured to be movable along the third direction 16 and on the base 244a. Moreover, the body 244b is configured to be rotatable on the base 244a. The main arm 244c is coupled to the body 244b, and is configured to move forward and backward relative to the body 244b. A plurality of main arms 244c are arranged to be individually driven. The main arms 244c are arranged to be spaced apart from each other along the third direction 16 in a stacked manner.

The liquid treating chamber 260 supplies treating liquid to the substrate W to performs a liquid treating process. The treating liquid may include chemical, rinse liquid, and organic solvent. The chemical may include an acid or base liquid. The chemical may include sulfuric acid ($H_2SO_4$), phosphoric acid ($P_2O_5$), HF (hydrofluoric acid), and ammonium hydroxide ($NH_4OH$). The chemical may include a DSP (Diluted Sulfuric acid Peroxide) mixed liquid. The rinse liquid may include pure water ($H_2O$). The organic solvent may include an isopropyl alcohol (IPA) liquid.

The liquid treating chamber 260 may perform a cleaning process. The substrate treating apparatuses respectively disposed in the liquid treating chambers 260 may have varying structures depending on types of cleaning processes to be performed therein. Alternatively, the substrate treating apparatuses disposed in the liquid treating chambers 260 respectively may have the same structure. Optionally, the liquid treating chambers 260 may be divided into a plurality of groups. In this connection, the substrate treating apparatuses respectively disposed in the liquid treating chambers 260 belonging to the same group may have the same structure. Structures of the substrate treating apparatuses respectively disposed in the liquid treating chambers 260 belonging to different groups may be different from each other. Moreover, the liquid treating chamber 260 may perform various processes such as photographing, ashing, and etching.

The laser treating chamber 280 may irradiate laser beams to the substrate W to perform a process of treating the substrate. Moreover, a substrate treating apparatus 300 may be disposed in the laser treating chamber 280. The substrate treating apparatus 300 may irradiate a laser beam onto the substrate W. The substrate treating apparatus 300 may irradiate the laser beam to an edge region of the substrate W. The Substrate treating apparatus 300 may perform a process of removing the film from the substrate W by irradiating the laser beam to the edge region of the substrate W.

Figure 4:
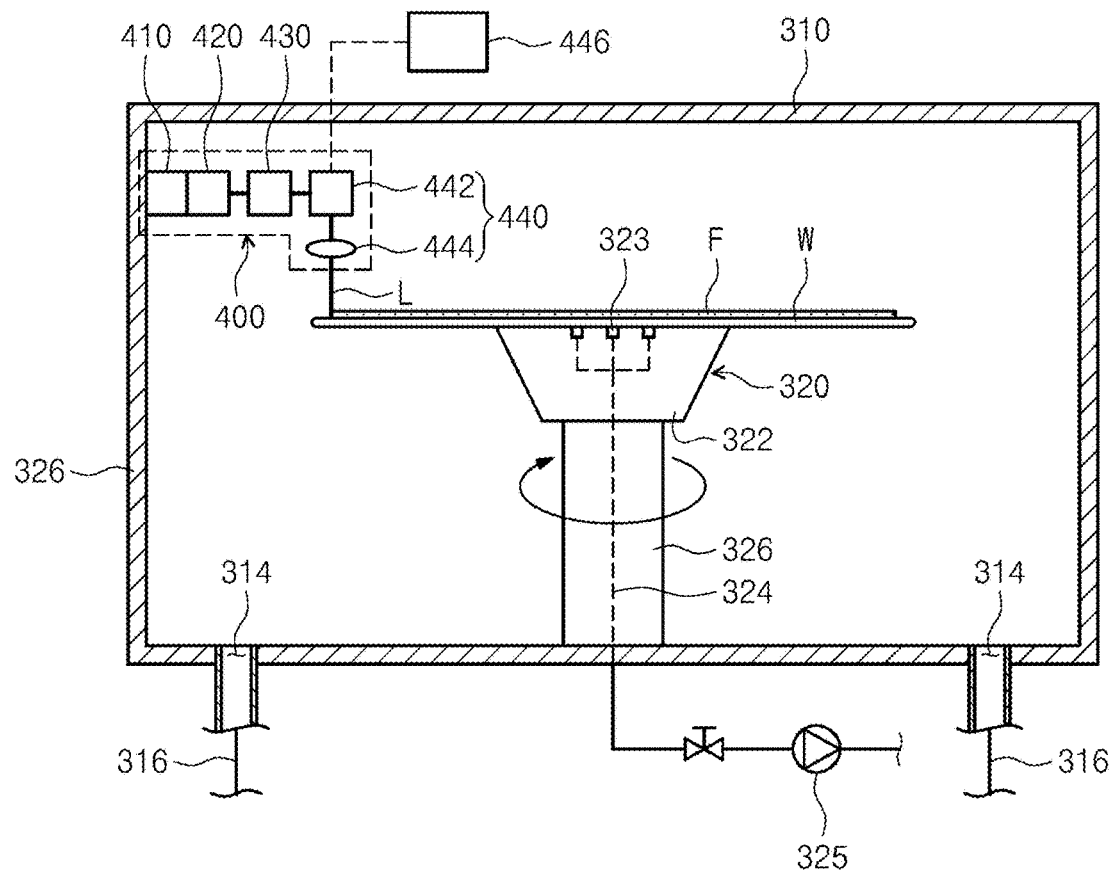
FIG. 4 is a cross-sectional view showing a substrate treating apparatus of FIG. 3.

Hereinafter, the substrate treating apparatus 300 disposed in the laser treating chamber 280 will be described in detail. FIG. 4 is a cross-sectional view showing the substrate treating apparatus of FIG. 3. Referring to FIG. 4, the substrate treating apparatus 300 may include a housing 310, a support unit 320, a laser irradiation unit 400, and a controller (not shown).

The housing 310 has an inner space 312 defined therein. The inner space 312 may act as a space where the substrate W is processed. An opening (not shown) is defined in one side portion to the housing 310. The opening functions as an entrance through which the substrate W enters or exits the inner space of the housing 310. A door (not shown) is installed at the opening. The door opens and closes the opening. When the substrate treating process is in progress, the door closes the opening to seal the inner space 312 of the housing 310. An exhaust port 314 is formed on a bottom surface of the housing 310. The exhaust port 314 is connected to an exhaust line 316. Accordingly, by-products generated as the substrate W is processed in the inner space 312 may be exhausted out of the substrate treating apparatus 300. Moreover, a gas supply line (not shown) for supplying gas to the inner space 312 may be connected to the housing 310. The gas may be an inert gas such as nitrogen. The gas supplied via the gas supply line may generate air flow in the inner space 312. The air flow generated in the inner space 312 enables more efficient evacuation of the byproducts generated as the substrate W is processed.

The support unit 320 supports and rotates the substrate W. The support unit 320 may include a support plate 322 and a rotatable shaft 326. The support plate 322 supports the substrate W. The support plate 322 is configured to have a circular plate shape. The support plate 322 may be constructed such that a diameter of a top surface thereof is larger than a diameter of a bottom surface thereof. A side surface connecting the top surface and the bottom surface of the support plate 322 to each other may be downwardly and inwardly inclined. The top surface of the support plate 322 act as a seat surface on which the substrate W rests. The seat surface has a smaller area than that of the substrate W. According to one example, a diameter of the seat surface may be smaller than a radius of the substrate W. The seat surface supports a central region of the substrate W. A plurality of suctioning holes 323 are defined in the seat surface. The suctioning holes 323 may act to suction the substrate W placed on the seat surface while the suctioning holes 323 are depressurized. To this end, a vacuum member 325 is connected to the suctioning holes 323. The vacuum member 325 may be embodied as a pump that depressurizes the suctioning holes 323. However, the vacuum member 325 is not limited to the pump, and may be variously modified to a known apparatus that depressurizes the suctioning holes 323.

The rotatable shaft 326 is configured to have a tubular shape extending vertically. The rotatable shaft 326 is joined to a bottom surface of the support plate 322. An actuator (not shown) transmits a rotational force to the rotatable shaft 326. The rotatable shaft 326 is rotatable about a central axis using the rotational force provided from the actuator. The support plate 322 is rotatable together with rotation of a rotatable shaft 326. A rotation speed of the rotatable shaft 326 is controlled by a driver, so that a rotation speed of the substrate W is adjusted in a corresponding manner. For example, the driver may be embodied as a motor. However, the driver is not limited to the motor, and may be variously modified to a known apparatus that applies the rotational force to the rotatable shaft 326.

The laser irradiation unit 400 may irradiate laser L onto the substrate W supported on the support unit 320. The laser irradiation unit 400 may irradiate a plurality of unit pulse laser beams L on the substrate W supported on the support unit 320. The laser irradiation unit 400 may irradiate the laser L to the edge region of the substrate W. The laser irradiation unit 400 may irradiate the laser L to remove the film disposed on the edge region of the substrate W. The laser irradiation unit 400 may include a laser light source 410, a wavelength adjusting member 420, a shape adjusting member 430, and a laser irradiation member 440.

The laser light source 410 may irradiate the laser L. The laser light source 410 may be embodied as a source of the laser L irradiated to the substrate W. The laser light source 410 may irradiate the laser L in a plurality of unit pulse laser beams manner.

The wavelength adjusting member 420 may change a wavelength of the laser L coming from the laser light source

410. For example, the wavelength adjusting member 420 may be embodied as an optical device that changes the wavelength of the laser L. The wavelength adjusting member 420 may change the wavelength of the laser L so that the laser L has a wavelength ranging from 150 nm to 1200 nm. This is because when the laser L has a wavelength of 150 nm or smaller, not only the film on the substrate W but also the substrate W are etched away, whereas when the laser L has a wavelength of 1200 nm or greater, the film on the substrate W is not removed. Moreover, the wavelength adjusting member 420 may adjust the wavelength of the laser L so that the laser L has a wide range of wavelengths. For example, the wavelength adjusting member 420 may change the wavelength of the laser L such that the laser L has a wavelength of one range selected from a first range of 750 nm to 1200 nm, a second range of 380 nm to 749 nm, a third range of 300 nm to 379 nm, and a fourth range of 150 nm to 299 nm.

The shape adjusting member 430 may change a shape of the laser L irradiated from the laser light source 410. For example, the shape adjusting member 430 may allow the laser L irradiated from the laser light source 410 to have a circular shape. Moreover, the shape adjusting member 430 may allow the laser L irradiated from the laser light source 410 to have a quadrangular shape. The quadrangular shape may have a square shape or a rectangular shape. Moreover, the shape adjusting member 430 may allow the laser L irradiated from the laser light source 410 to have a quadrangular shape having a round corner.

The laser irradiation member 440 may irradiate the laser L to the substrate W supported on the support unit 320. For example, the laser L irradiated from the laser light source 410 passes through the wavelength adjusting member 420 and the shape adjusting member 430. Thus, the wavelength adjusting member 420 and the shape adjusting member 430 may adjust the wavelength and the shape thereof. Then, the laser L having the varied shape and wavelength may be transferred to the laser irradiation member 440. The laser irradiation member 440 may include a scanner 442, a lens 444, and a driving member 446. The scanner 442 may change an irradiation direction of the laser L passing through the wavelength adjusting member 420 and the shape adjusting member 430. The lens 444 allows the laser L passing through the scanner 442 to be concentrated onto the substrate W. The driving member 446 may move the scanner 442 and/or the lens 444. The driving member 446 may transmit a driving force for moving the scanner 442 and/or the lens 444. The driving member 446 may move the scanner 442 and/or the lens 444 in a horizontal or a vertical direction. Thus, the driving member 446 may allow the plurality of unit pulse laser beams L to be irradiated to the edge region of the substrate W. Moreover, the driving member 446 may allow a target region of the substrate W receiving the plurality of unit pulse laser beams L to move along a radial direction of the substrate W.

The controller (not shown) may control the substrate treating system 10. For example, the controller may control the transfer of the substrate W between the liquid treating chambers 260, between the laser treating chambers 280, and between the liquid treating chambers 260 and the laser treating chambers 280. In addition, the controller may control the substrate treating apparatus 300. The controller may control the substrate treating apparatus 300 to perform the film removing method or the substrate treating method as described below.

Hereinafter, a method for treating a substrate according to one embodiment of the inventive concept will be described in detail. The method for treating the substrate may include a method for removing the film on the substrate W by irradiating a plurality of laser beams onto the edge region of the substrate W. The film on the substrate W may be a film formed using a deposition process. For example, the film on the substrate W may be made of TiN, SiN, tungsten, oxide, or the like. However, the substrate treating method according to one embodiment of the inventive concept is not limited to the method for removing the film, and may be equally applied to various treating methods for treating the substrate by irradiating the laser onto the substrate W.

Figure 5:
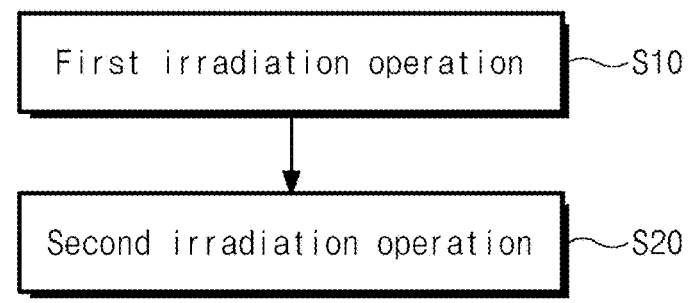
FIG. 5 is a flow chart showing a substrate treating method according to one embodiment of the inventive concept.

FIG. 5 is a flow chart showing a substrate treating method according to one embodiment of the inventive concept. Referring to FIG. 5, the substrate treating method may include a first irradiation operation S10 and a second irradiation operation S20. The first irradiation operation S10 and the second irradiation operation S20 may be performed sequentially. For example, the second irradiation operation S20 may be performed after the first irradiation operation S10. In the first irradiation operation S10 and the second irradiation operation S20, the plurality of unit pulse laser beams may be irradiated to the edge region of the substrate W to remove the film from the substrate W. The plurality of unit pulse laser beams may be embodied as a plurality of ultra-short pulsed laser beams. For example, a unit pulse laser beam of the plurality of unit pulse laser beams may have a pulse width of several tens of ns to hundreds of fs. When the plurality of ultra-short pulsed laser beams are irradiated to the film on the substrate W in a non-thermal contactless manner, an immediate ablation phenomenon may occur in the film. Thus, it is possible to remove an unnecessary portion of the film from the edge region of the substrate W.

Moreover, the unit pulse laser beam irradiated in the first irradiation operation S10 and/or the second irradiation operation S20 may have a wavelength below an ablation threshold at which the ablation occurs in the film on the substrate W. For example, the unit pulse laser beam irradiated in the first irradiation operation S10 and/or the second irradiation operation S20 may have a wavelength of 150 nm to 1200 nm. This because when the laser beam with a wavelength exceeding the ablation threshold of the film is irradiated to the substrate W, not only the film on the substrate W may be etched but also an over-etching phenomenon in which the substrate W is etched away may occur. Thus, in one embodiment of the inventive concept, in the first irradiation operation S10 and/or the second irradiation operation S20, the laser beam having a wavelength below the ablation threshold of the film on the substrate W is irradiated, such that complete film etch occurs or under-etching in which the film partially remains at several nm thickness occurs.

Figure 6:
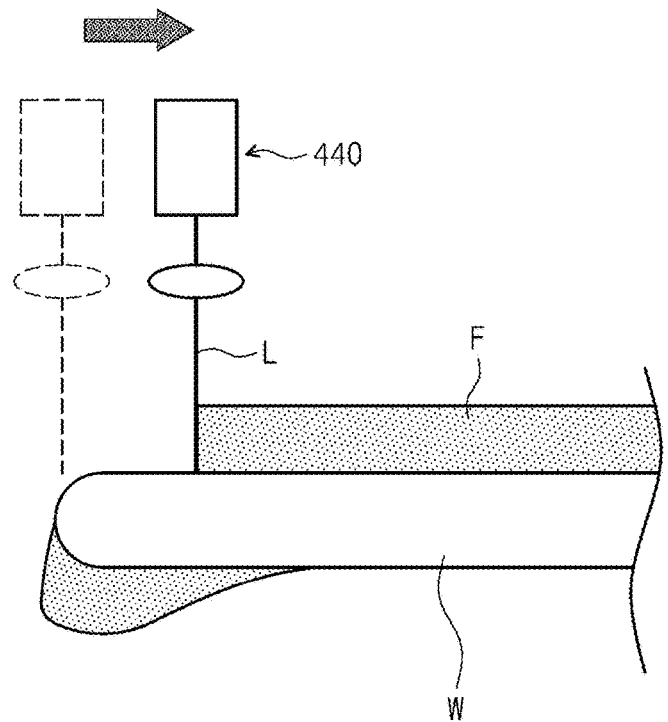
FIG. 6 is a view showing an example in which a laser irradiation unit irradiates a laser beam to a substrate.

Moreover, in the first irradiation operation S10 and/or the second irradiation operation S20, irradiation of the unit pulse laser beams L may be performed along the circumferential direction of the substrate W by rotation of the substrate W, as shown in FIG. 6.

Moreover, in the first irradiation operation S10 and/or the second irradiation operation S20, an irradiation position of the unit pulse laser beams L may be displaced along the radial direction of the substrate W. Accordingly, it is possible to expand or reduce the edge region where the film F is removed from the substrate W.

Figure 7:
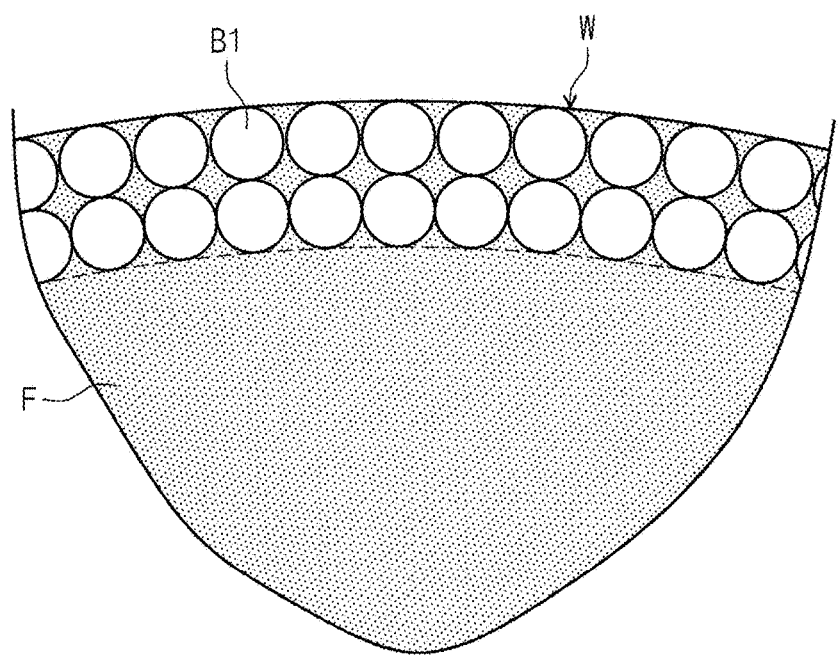
FIG. 7 is an enlarged view showing an edge region of a substrate which is subjected to a first irradiation operation of FIG. 6.

FIG. 7 is an enlarged view showing the edge region of the substrate subjected to the first irradiation operation of FIG.

Figure 8:
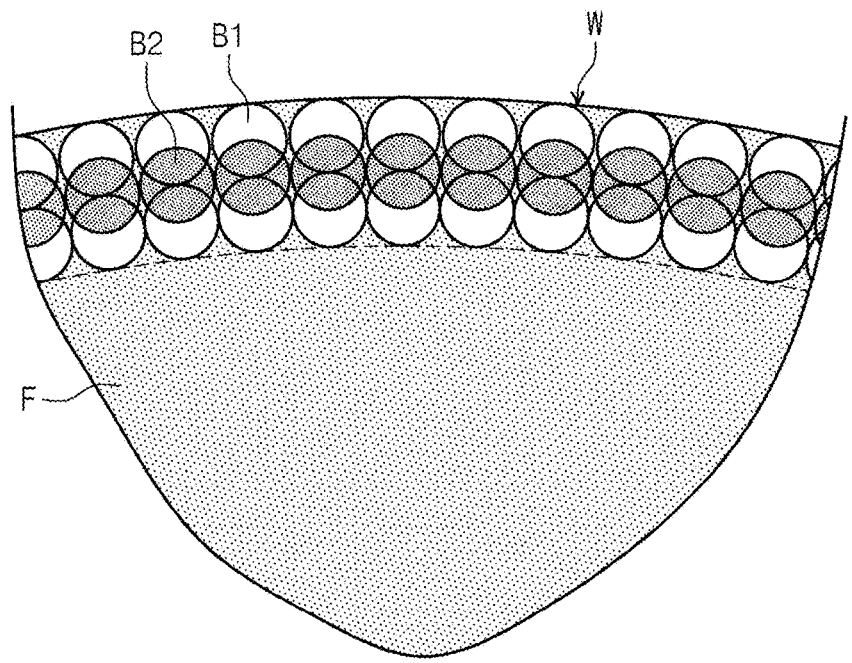
FIG. 8 is an enlarged view showing an edge region of a substrate which is subjected to a second irradiation operation of FIG. 6.

6. FIG. 8 is an enlarged view showing the edge region of the substrate subjected to the second irradiation operation of FIG. 6.

Referring to FIG. 7 and FIG. 8, the first irradiation operation S10 may include irradiating the plurality of unit pulse laser beams to the edge region of the rotating substrate. In the first irradiation operation S10, a pulse width and/or a rotation speed of the substrate W may be set so that regions B1 of the substrate W receiving the unit pulse laser beams respectively do not overlap with each other. Moreover, in the first irradiation operation S10, the unit pulse laser beams may be irradiated such that the regions B1 onto which the beams are irradiated respectively are adjacent to each other. Moreover, in the first irradiation operation S10, the unit pulse laser beams are irradiated to the rotating substrate W to remove the film F. Then, after changing the irradiation position of the unit pulse laser beams along the radial direction of the substrate W, the unit pulse laser beams are irradiated to the rotating substrate W to remove the film F. Moreover, each of the unit pulse laser beams irradiated in the first irradiation operation S10 may have a circular shape.

The second irradiation operation S20 may be performed when a preset time has elapsed after the treating of the edge region of the substrate W is completed in the first irradiation operation S10. In the second irradiation operation S20, the unit pulse laser beams may be irradiated to regions B2 onto which the unit pulse laser beams are not irradiated in the first irradiation operation S10. For example, in the second irradiation operation S20, the unit pulse laser beams may be irradiated to the region B2 between adjacent irradiation regions B1 among the regions B1 onto which the unit pulse laser beams are irradiated in the first irradiation operation S10. Moreover, in the second irradiation operation S20, the unit pulse laser beams are irradiated to the rotating substrate W to remove the film F. Then, after changing the irradiation position of the unit pulse laser beams along the radial direction of the substrate W, the unit pulse laser beams are irradiated to the rotating substrate W to remove the film F. Moreover, each of the unit pulse laser beams irradiated in the second irradiation operation S20 may have a circular shape.

Figure 2:
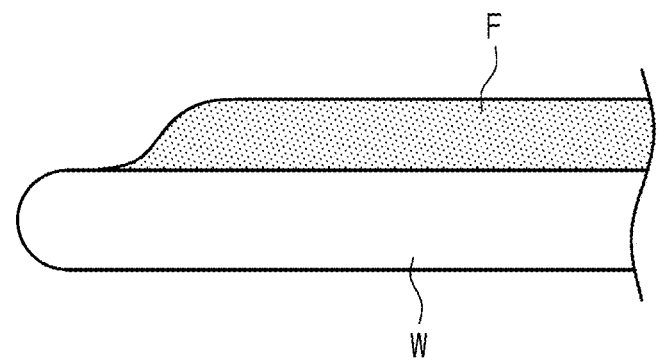
FIG. 2 is an enlarged view showing a 'A' region of FIG. 1.

Conventionally, when spraying chemical such as etching liquid to the edge region of the substrate to remove the film, the film removal is not properly achieved. For example, the film on the substrate may be removed obliquely downwardly and inwardly along the radial direction of the substrate as shown in FIG. 2. This is due to non-uniform selectivity of the chemical used for removing the film. When the film is not properly removed, a production yield of a semiconductor device is reduced. Moreover, a pin mark, etc., is formed on a substrate surface to cause additional contamination. However, according to an embodiment of the inventive concept, the plurality of unit pulse laser beams are irradiated onto the substrate W to remove the film from the substrate W. Accordingly, the immediate ablation of the film on the substrate W occurs, such that the film is removed at uniform and high selectivity. Moreover, according to one embodiment of the inventive concept, the film on the substrate W is removed using the plurality of the unit pulse laser beams, a shape and/or a position of the region where the film is removed from the substrate W may vary. Moreover, the region where the film is removed from the substrate W may be minimized. The approach in which the shape and/or the position of the region where the film is removed from the substrate W varies and the region where the film is removed from the substrate W is minimized may satisfy recent requirements in a semiconductor device manufacturing process.

Figure 9:
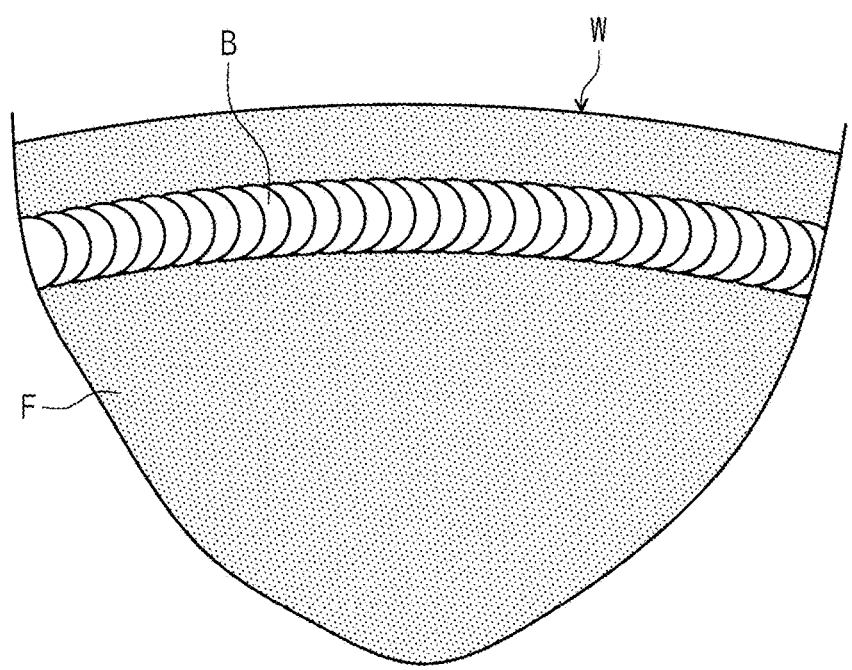
FIG. 9 is a view showing a conventional method for treating an edge region of a substrate.

Moreover, when irradiating the plurality of unit pulse laser beams to remove the film from the substrate, the heat accumulation (ablation threshold) may occur. For example, as shown in FIG. 9, when the regions B where the unit pulse laser beams are irradiated continuously overlap each other, the heat accumulation (ablation threshold) occurs in the film F on the substrate W. The heat accumulation (ablation threshold) generated in the film F may deform the substrate W or the film on a region other than the edge region of the substrate W. Accordingly, according to an embodiment of the inventive concept, in the first irradiation operation S10, the plurality of unit pulse laser beams are irradiated on the substrate W so that the laser beams do not overlap each other. Therefore, the unit pulse laser beams are not irradiated to the same region of the substrate W in an overlapping manner. Accordingly, the heat accumulation (ablation threshold) in the film may be minimized. Moreover, the second irradiation operation S20 may be performed when a preset time has elapsed after the first irradiation operation S10 has been completed. That is, the first irradiation operation S10 is performed, and, then, the film has been cooled down, and, then, the second irradiation operation S20 is performed. Accordingly, the heat accumulation (ablation threshold) in the film may be minimized. Moreover, a time duration for which the film has been cooled down may be set based on a measured temperature of the film subjected to the first irradiation operation S10.

Figure 10:
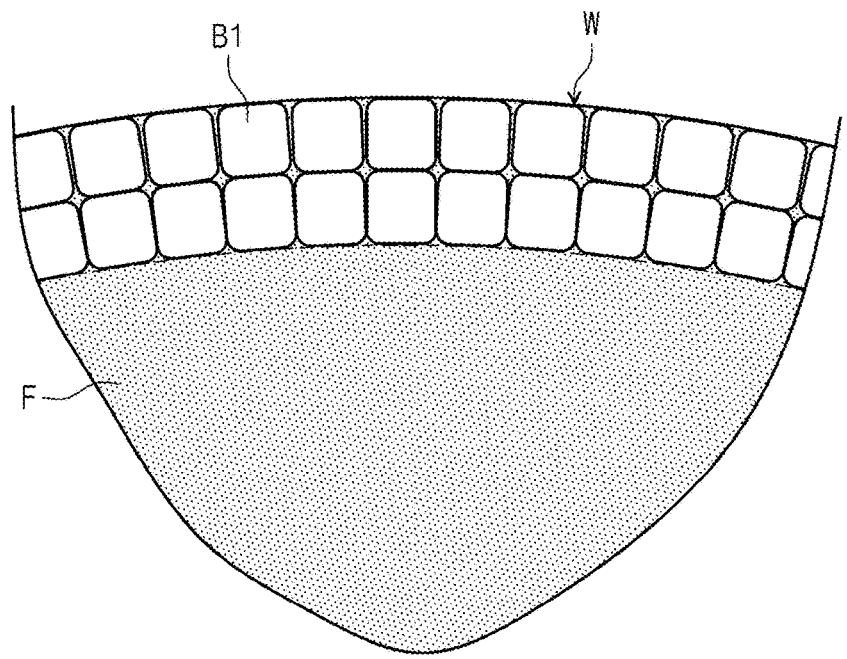
FIG. 10 and FIG. 11 are views showing a substrate treating method according to another embodiment of the inventive concept.
Figure 11:
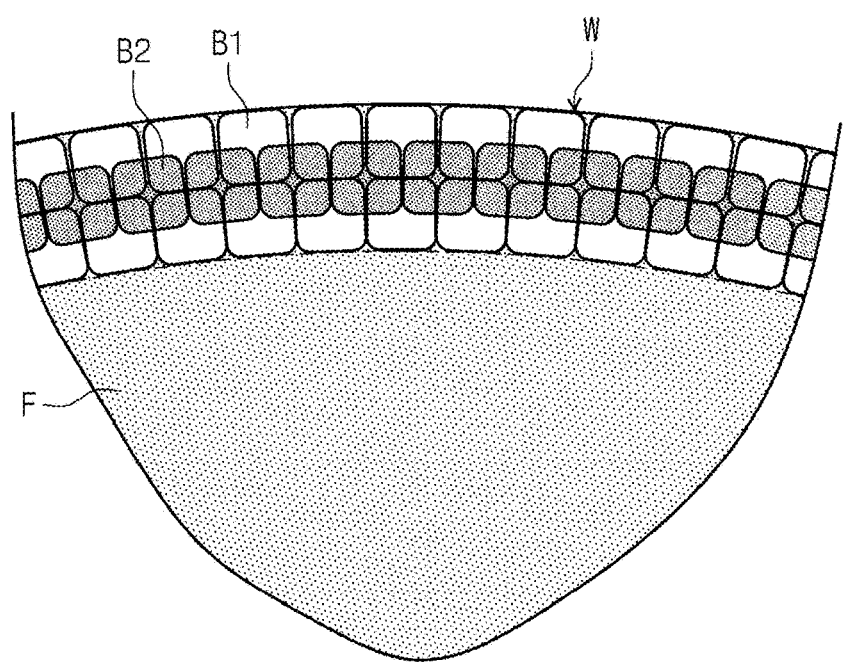
Figure 12:
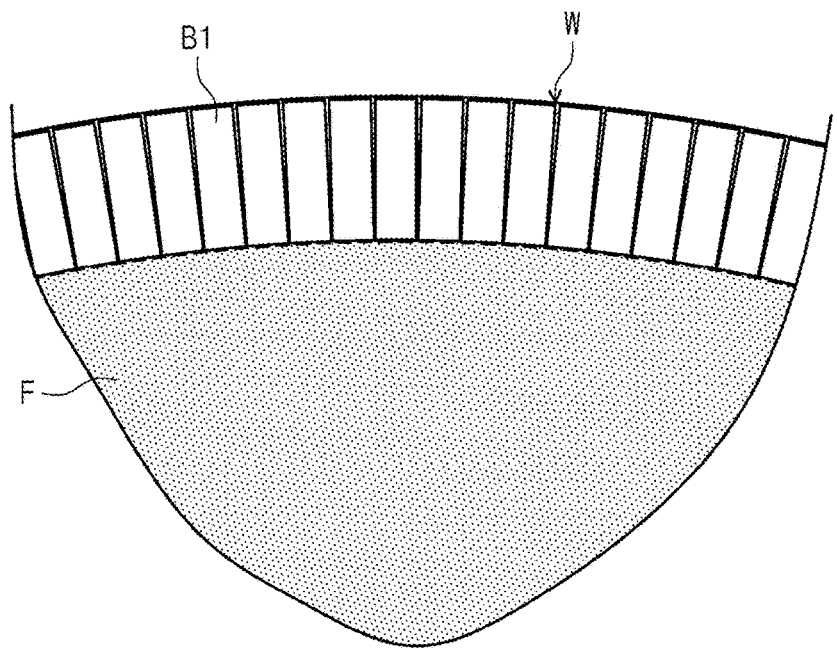
FIG. 12 and FIG. 13 are views showing a substrate treating method according to another embodiment of the inventive concept.
Figure 13:
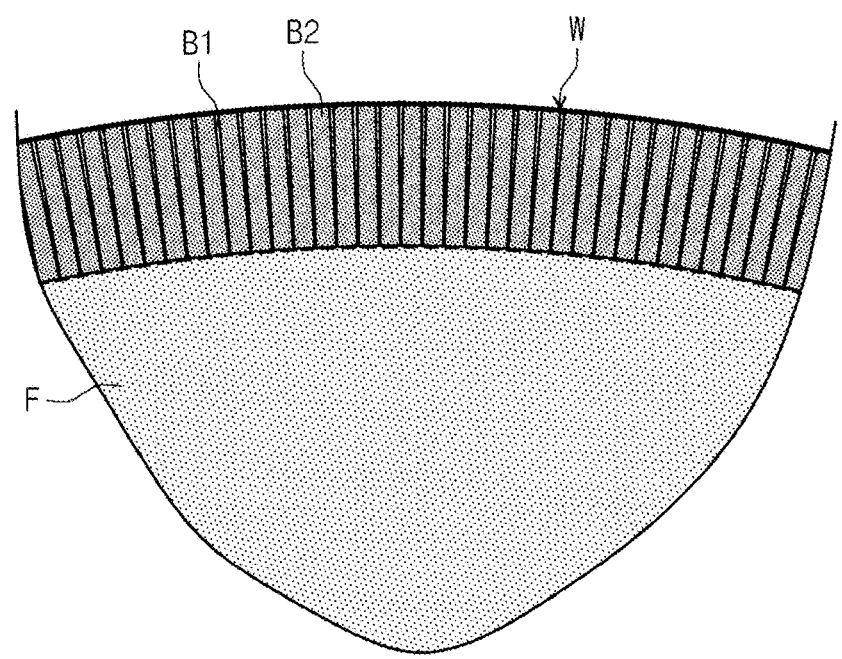

In the above example, each of the unit pulse laser beams irradiated in the first irradiation operation S10 and the second irradiation operation S20 has the circular shape. However, the shape is not limited thereto. For example, as shown in FIG. 10 and FIG. 11, each of the unit pulse laser beams irradiated in the first irradiation operation S10 and the second irradiation operation S20 may have a square shape with a rounded corner. Moreover, as shown in FIG. 12 and FIG. 13, each of the unit pulse laser beams irradiated in the first irradiation operation S10 and the second irradiation operation S20 may have a rectangular shape with a rounded corner.

According to one embodiment of the inventive concept, the film removing efficiency may be maximized.

Furthermore, according to one embodiment of the inventive concept, the plurality of unit pulse laser beams may be irradiated to the film on the substrate to increase the film removal efficiency.

Moreover, according to one embodiment of the inventive concept, an area of the film removed region may be minimized and a shape and/or a location of the film removed region may be variously changed.

Moreover, according to one embodiment of the inventive concept, the deformation due to heat accumulation (ablation threshold) at the substrate or the film in a region other than the edge region of the substrate may be minimized.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for removing a film from a substrate by irradiating a plurality of unit pulse laser beams to an edge region of the substrate, the method comprising:
   a first irradiation operation for irradiating the plurality of unit pulse laser beams onto first regions the substrate while the substrate is rotating; and a second irradiation operation for irradiating the plurality of unit pulse laser beams to second regions of the substrate onto which the unit pulse laser beams are not irradiated in the first irradiation operation,
wherein the first irradiation operation irradiates the first regions with the unit pulse laser beams at one or more first operation radial distances along a circumference of the substrate such that each of the first regions do not overlap.

2. The method of claim 1, wherein the first irradiation operation and the second irradiation operation are sequentially performed, and
wherein the second irradiation operation is performed when a preset time has elapsed after the first irradiation operation is completed.

3. The method of claim 1, wherein each of the unit pulse laser beams has a wavelength below an ablation threshold at which ablation occurs in the film.

4. The method of claim 3, wherein each of the unit pulse laser beams has a wavelength of 150 nm to 1200 nm.

5. The method of claim 1, wherein each of the unit pulse laser beams irradiated to the substrate in the first irradiation operation and/or the second irradiation operation has a cross-sectional circular shape.

6. The method of claim 1, wherein each of the unit pulse laser beams irradiated to the substrate in the first irradiation operation and/or the second irradiation operation has a cross-sectional quadrangular shape.

7. The method of claim 1, wherein the first irradiation operation includes:
irradiating the unit pulse laser beams while an irradiation position of the unit pulse laser beams is displaced along a circumferential direction of the substrate while the substrate rotates; and
irradiating the unit pulse laser beams while an irradiation position of the unit pulse laser beams is displaced along a radial direction of the substrate.

8. The method of claim 1, wherein the second irradiation operation includes:
irradiating the unit pulse laser beams while an irradiation position of the unit pulse laser beams is displaced along a circumferential direction of the substrate while the substrate rotates; and
irradiating the unit pulse laser beams while an irradiation position of the unit pulse laser beams is displaced along a radial direction of the substrate.

9. The method of claim 1, wherein the second irradiation operation irradiates the second regions with the unit pulse laser beams at a second operation radial distance along the circumference of the substrate.

10. The method of claim 9, wherein each of the second regions do not overlap each other.

11. The method of claim 10, wherein each of the second regions overlap more than one first region.

12. The method of claim 11, wherein the first operation radial distances of the first irradiation operation include a first radial distance and a second radial distance, the first and the second radial distances are different from each other.

13. The method of claim 12, wherein the second operation radial distance is between the first radial distance and the second radial distance of the first irradiation operation.

14. The method of claim 2, wherein the preset time is based on a measured temperature of the film subjected to the first irradiation operation.

15. The method of claim 1, wherein the unit pulse laser beams of the first and second irradiation operation irradiates on a top surface of the film on the substrate.

* * * * *